(12) United States Patent
Okano

(10) Patent No.: US 8,679,882 B2
(45) Date of Patent: Mar. 25, 2014

(54) METHOD OF MANUFACTURING SEMICONDUCTOR DEVICE, SEMICONDUCTOR DEVICE, AND SEMICONDUCTOR APPARATUS

(75) Inventor: Taichi Okano, Chichibu (JP)

(73) Assignee: Show A Denko K.K., Tokyo (JP)

( * ) Notice: Subject to any disclaimer, the term of this patent is extended or adjusted under 35 U.S.C. 154(b) by 131 days.

(21) Appl. No.: 13/144,159

(22) PCT Filed: Jan. 13, 2010

(86) PCT No.: PCT/JP2010/000131
§ 371 (c)(1), (2), (4) Date: Jul. 12, 2011

(87) PCT Pub. No.: WO2010/082476
PCT Pub. Date: Jul. 22, 2010

(65) Prior Publication Data
US 2011/0272711 A1 Nov. 10, 2011

(30) Foreign Application Priority Data

Jan. 16, 2009 (JP) ................................ 2009-007687
Jan. 8, 2010 (JP) ................................ 2010-002842

(51) Int. Cl.
*H01L 21/00* (2006.01)

(52) U.S. Cl.
USPC .......................................................... 438/46

(58) Field of Classification Search
None
See application file for complete search history.

(56) References Cited

U.S. PATENT DOCUMENTS 6,274,889 B1 * 8/2001 Ota et al. ................... 257/77
6,610,572 B1 8/2003 Takei et al.

(Continued)

FOREIGN PATENT DOCUMENTS

JP 4-171717 A 6/1992
JP 06-045354 A 2/1994

(Continued)

OTHER PUBLICATIONS

Ota, Y. et al, "Laser Alloying for Ohmic Contacts on SiC at Room Temperature", Materials Science Forum, Trans Tech Publications Ltd- Switzerland, CH, vol. 264-268, Jan. 1, 1998, pp. 783-786, XP008039383, ISSN: 0255-5476.

(Continued)

*Primary Examiner* — Charles Garber
*Assistant Examiner* — Andre' C Stevenson
(74) *Attorney, Agent, or Firm* — Sughrue Mion, PLLC

(57) ABSTRACT

There is provided a method of manufacturing a semiconductor device, a semiconductor device, and a semiconductor apparatus, by which an electrode having an excellent ohmic property can be formed, and a semiconductor device having excellent device characteristics can be obtained with a high product yield. The method sequentially includes: a semiconductor device structure formation process in which a semiconductor device structure 3 is formed at least in a main surface 2a side of a first conduction type silicon carbide bulk substrate 2 having a main surface 2a and a rear surface 2b; and an ohmic electrode formation process in which an ohmic electrode 4 making ohmic contact with the silicon carbide bulk substrate 2 is formed in the rear surface 2b side of the silicon carbide bulk substrate 2, wherein the ohmic electrode formation process sequentially includes a sub-process of thinning the silicon carbide bulk substrate 2 by polishing the rear surface side 2b of the silicon carbide bulk substrate 2 and then forming the ohmic electrode 4 in the rear surface 2b, and a sub-process of performing heat treatment using an optical heating method in which high-power light is irradiated from the rear surface side 2b of the silicon carbide bulk substrate 2 to the ohmic electrode 4.

19 Claims, 5 Drawing Sheets

(56) References Cited

U.S. PATENT DOCUMENTS

| | | | |
|---|---|---|---|
| 2005/0042788 A1* | 2/2005 | Ueda | 438/46 |
| 2005/0104072 A1* | 5/2005 | Slater et al. | 257/77 |
| 2006/0215722 A1 | 9/2006 | Tanaka et al. | |
| 2007/0243722 A1* | 10/2007 | Nakamura et al. | 438/787 |
| 2007/0290211 A1* | 12/2007 | Nakayama et al. | 257/77 |

FOREIGN PATENT DOCUMENTS

| | | |
|---|---|---|
| JP | 8-264468 A | 10/1996 |
| JP | 09-008062 A | 1/1997 |
| JP | 10-284436 A | 10/1998 |
| JP | 2000-277448 A | 10/2000 |
| JP | 2001-160559 A | 6/2001 |
| JP | 2002-026341 | 1/2002 |
| JP | 2002-289550 A | 10/2002 |
| JP | 2003-257885 A | 9/2003 |
| JP | 2008-135611 | 6/2008 |
| JP | 2008-153442 A | 7/2008 |
| WO | 2007/035333 A1 | 3/2007 |

OTHER PUBLICATIONS

Supplementary European Search Report issued on May 10, 2013 from the European Patent Office in corresponding European Application No. 10731146.6.

Office Action dated Aug. 27, 2013 from the Japanese Patent Office in a counterpart Japanese Application No. 2010-002842.

* cited by examiner

METHOD OF MANUFACTURING SEMICONDUCTOR DEVICE, SEMICONDUCTOR DEVICE, AND SEMICONDUCTOR APPARATUS

CROSS REFERENCE TO RELATED APPLICATIONS

This application is a National Stage of International Application No. PCT/JP2010/000131 filed Jan. 13, 2010, claiming priority based on Japanese Patent Application Nos. 2009-007687 filed Jan. 16, 2009 and 2010-002842 filed Jan. 8, 2010, the contents of all of which are incorporated herein by reference in their entirety.

BACKGROUND OF THE INVENTION

1. Technical Field

The present invention relates to a method of manufacturing a semiconductor device, a semiconductor device, and a semiconductor apparatus, and more particularly, to a method of manufacturing a semiconductor device including an electrode making ohmic contact with a silicon carbide bulk substrate, a semiconductor device, and a semiconductor apparatus.

2. Description of Related Art

In the related art, semiconductors made of silicon carbide (hereinafter, also referred to as SiC) are very suitably used in a semiconductor substrate because they yield excellent physical properties having a wide band gap characteristic, and the constituent elements thereof are nearly inexhaustibly present in the natural world.

Since the SiC has a covalent bond crystal structure, it is very stable in a physical sense, and has a high band gap and a high melting point. For this reason, in a case where the ohmic electrode is formed in the silicon carbide (SiC) semiconductor substrate, it is necessary to perform heat treatment (such as annealing) at a higher temperature than a temperature used to form a Schottky electrode.

As a heat treatment method for obtaining ohmic contact between the semiconductor substrate and the electrode, there has been proposed a method of irradiating laser light with an irradiation energy level capable of preventing crystal materials from becoming molten to an ion-implanted SiC semiconductor substrate (for example, refer to Patent Documents 1 and 2).

In addition, there has been proposed another method in which a reflectance control film, by which reflectance is reduced as the film thickness is reduced for irradiation of laser light, is formed on a semiconductor substrate, the reflectance control film is etched, and then, the laser light is irradiated to the semiconductor substrate for performing an annealing process (for example, refer to Patent Document 3).

However, in a case where heat treatment is performed for forming an ohmic electrode after forming a Schottky electrode in the SiC semiconductor substrate, characteristics of the Schottky electrode may be degraded due to a high temperature. Therefore, in the related art, it is necessary to form the ohmic electrode before forming the Schottky electrode in order to manufacture the semiconductor device using the SiC semiconductor substrate.

Hereinafter, a process of forming the Schottky electrode in the SiC semiconductor substrate will be exemplarily described for top-and-bottom electrode type Schottky barrier diodes 100 and 200 shown in FIGS. 6A and 6B.

As shown in FIG. 6A, a series resistance within a device structure of the Schottky barrier diode 100 can be expressed as a sum of a resistance at an interface between the Schottky electrode 122 and the SiC semiconductor epitaxial layer 121 and internal resistances of the Schottky electrode 122, the SiC semiconductor epitaxial layer 121, the n⁺ SiC semiconductor substrate 110, and the ohmic electrode 130. A lower series resistance yields reduced operational power loss and excellent device characteristics. For this reason, in order to effectively reduce the series resistance of the Schottky barrier diode, there has been proposed a method in which the Schottky barrier diode may be thinned by polishing the n⁺ SiC semiconductor substrate 210 while the Schottky electrode 222, the SiC semiconductor epitaxial layer 221, and the ohmic electrode 230 are left as is to maintain other characteristics as in the Schottky barrier diode 200 shown in FIG. 6B. However, if the n⁺ SiC semiconductor substrate 210 is thinned too much, the substrate strength is reduced so that the semiconductor device may be broken.

For this reason, in the related art, the semiconductor device having the Schottky electrode formed on the SiC semiconductor substrate has been used without polishing the SiC semiconductor substrate. However, in a case where the SiC semiconductor substrate is used without the polishing, the thickness of the substrate inevitably increases, and the series resistance within the device structure also increases as described above, which may cause a lot of power loss and degradation of device characteristics.

Here, in order to obtain ohmic contact between the semiconductor substrate and the electrode without performing the heat treatment described above, there has been proposed a method in which the semiconductor device structure is formed in the main surface side of the silicon semiconductor substrate, the rear surface side of the semiconductor substrate is polished in a final process, impurity ions having the same conduction type as that of the rear surface are implanted, and then, a metal thin film corresponding to the ohmic electrode is formed (for example, refer to Patent Document 4). However, in a case where the top-and-bottom electrode type semiconductor device is manufactured using the method disclosed in Patent Document 4, it is not possible to form the ohmic electrode before forming the Schottky electrode. For this reason, as described above, characteristics of the Schottky electrode may be degraded due to a high temperature during the heat treatment of the ohmic electrode.

In addition, there has been proposed a method including a process of depositing a metal film on the SiC semiconductor substrate and a process of performing heat treatment on a metal film by irradiating laser light from the rear surface side of the SiC semiconductor substrate to form an ohmic electrode by making ohmic contact between the metal film and the SiC semiconductor substrate (for example, refer to Patent Document 5). According to the method disclosed in Patent Document 5, it is possible to selectively perform heat treatment only on a portion where the ohmic electrode is formed by irradiating laser light from the rear surface side of the SiC semiconductor substrate. Therefore, it is possible to suppress the SiC semiconductor substrate and the device structure from being damaged.

However, for example, in a case where the manufacturing method disclosed in Patent Document 5 is applied to the top-and-bottom electrode type semiconductor device as shown in FIGS. 6A and 6B, a high-temperature heat is easily transferred from the rear surface side to the main surface side along the thickness direction of the SiC semiconductor substrate. For this reason, characteristics of the semiconductor device structure including the Schottky electrode or the semiconductor layer may be degraded.

Patent Literature

[Patent Document 1] Japanese Unexamined Patent Application Publication No. 2000-277448
[Patent Document 2] Japanese Unexamined Patent Application Publication No. 2002-289550
[Patent Document 3] Japanese Unexamined Patent Application Publication No. 2008-153442
[Patent Document 4] Japanese Unexamined Patent Application Publication No. 9-8062
[Patent Document 5] Japanese Unexamined Patent Application Publication No. 10-284436

SUMMARY OF THE INVENTION

The invention has been made to address the aforementioned problems, and provides a method of manufacturing a semiconductor device, by which an electrode having an excellent ohmic property can be formed, and semiconductor devices having excellent device characteristics can be obtained with a high product yield.

In addition, the invention provides a semiconductor device obtained through the aforementioned manufacturing method according to the invention, by which an electrode has an excellent ohmic property, and excellent device characteristics can be obtained.

Furthermore, the invention provides a semiconductor apparatus having the semiconductor device according to the invention.

The inventors diligently studied a semiconductor device having a silicon carbide bulk substrate in order to form an electrode having an excellent ohmic property on the rear surface of the substrate and manufacture a semiconductor device having excellent device characteristics. As a result, the inventors recognized that an ohmic electrode can be formed without degrading the characteristics of a semiconductor device structure including an electrode and a semiconductor layer even at a high temperature by locally performing heat treatment on the electrode of the rear surface of the substrate using an optical heating method and optimizing the heat treatment conditions of the process at this time. As a result, the inventors perceived that a semiconductor device having excellent device characteristics can be manufactured with a high product yield and made each of the inventions described below.

[1] According to an aspect of the invention, there is provided a method of manufacturing a semiconductor device, the method sequentially including: a semiconductor device structure formation process in which a semiconductor device structure is partially or wholly formed at least in a main surface side of a first conduction type silicon carbide bulk substrate having a main surface and a rear surface; and an ohmic electrode formation process in which an ohmic electrode making ohmic contact with the silicon carbide bulk substrate is formed in the rear surface side of the silicon carbide bulk substrate, wherein the ohmic electrode formation process sequentially includes a sub-process of thinning the silicon carbide bulk substrate by polishing the rear surface side of the silicon carbide bulk substrate and then forming the ohmic electrode in the rear surface, and a sub-process of performing heat treatment using an optical heating method in which high-power light is irradiated from the rear surface side of the silicon carbide bulk substrate to the ohmic electrode.

[2] In the method described in the paragraph [1], the high-power light is laser light.

[3] In the method described in the paragraph [2], the laser light is excimer laser light.

[4] In the method described in any one of the paragraphs [1] to [3], in the sub-process of performing heat treatment of the ohmic electrode formation process, the high-power light is irradiated in pulses.

[5] In the method described in the paragraph [4], in the sub-process of performing heat treatment of the ohmic electrode formation process, an irradiation energy density per pulse for irradiating the high-power light in pulses is set to 10 mJ/cm$^2$ or higher.

[6] In the method described in the paragraph [4] or [5], in the sub-process of performing heat treatment of the ohmic electrode formation process, an irradiation time per pulse for irradiating the high-power light in pulses is set to 10 μsec or shorter.

[7] In the method described in any one of the paragraphs [4] to [6], in the sub-process of performing heat treatment of the ohmic electrode formation process, a pulse cycle (pulse irradiation interval) for irradiating the high-power light in pulses is set to 5 μsec or longer.

[8] In the method described in any one of the paragraphs [1] to [7], the sub-process of performing heat treatment of the ohmic electrode formation process is carried out while at least one of the high-power light or the silicon carbide bulk substrate is linearly or rotatably moved.

[9] In the method described in any one of the paragraphs [1] to [8], in the sub-process of performing heat treatment of the ohmic electrode formation process, an irradiation time period of the high-power light at an arbitrary point in the rear surface side of the silicon carbide bulk substrate is set to one second or shorter.

[10] In the method described in any one of the paragraphs [1] to [9], in the sub-process of performing heat treatment of the ohmic electrode formation process, at least any one of a light emission shape of the high-power light or an irradiation shape of the high-power light on the ohmic electrode has a noncircular shape.

[11] In the method described in any one of the paragraphs [1] to [10], in the sub-process of performing heat treatment of the ohmic electrode formation process, an irradiation angle of the high-power light is set to less than 90° relative to the silicon carbide bulk substrate.

[12] In the method described in any one of the paragraphs [1] to [11], the sub-process of performing heat treatment of the ohmic electrode formation process is carried out by lowering a temperature of the main surface side to less than a temperature of the rear surface side by cooling at least the main surface side of the silicon carbide bulk substrate.

[13] In the method described in any one of the paragraphs [1] to [12], the rear surface of the silicon carbide bulk substrate is slanted at 0° to 10° from a carbon surface or a silicon surface.

[14] In the method described in any one of the paragraphs [1] to [13], the main surface of the silicon carbide bulk substrate is slanted at 0° to 10° from a carbon surface or a silicon surface.

[15] In the method described in any one of the paragraphs [1] to [14], the semiconductor device structure formation process sequentially includes a sub-process of forming a silicon carbide epitaxial layer at least in the main surface side of the silicon carbide bulk substrate, and a sub-process of forming a Schottky electrode making Schottky contact with the silicon carbide epitaxial layer over the silicon carbide epitaxial layer.

[16] In the method described in any one of the paragraphs [1] to [14], in the semiconductor device structure formation process, the semiconductor device structure is formed as a longitudinal type MOSFET (metal-oxide-semiconductor field-effect transistor) structure.

[17] In the method described in any one of the paragraphs [1] to [14], in the semiconductor device structure formation process, the semiconductor device structure is formed as a lateral type MOSFET (metal-oxide-semiconductor field-effect transistor) structure.

[18] In the method described in any one of the paragraphs [1] to [14], in the semiconductor device structure formation process, the semiconductor device structure is formed as a PN type diode structure.

[19] According to another aspect of the invention, there is provided a semiconductor device manufactured using the method described in any one of the paragraphs [1] to [18].

[20] According to still another aspect of the invention, there is provided a semiconductor apparatus having the semiconductor device described in the paragraphs [19].

According to the invention, there is provided a method of manufacturing a semiconductor device, the method sequentially including: a semiconductor device structure formation process in which a semiconductor device structure is formed in the main surface side of the silicon carbide bulk substrate and an ohmic electrode formation process in which an ohmic electrode making contact with the silicon carbide bulk substrate is formed in the rear surface side of the silicon carbide bulk substrate, wherein the ohmic electrode formation process sequentially includes a sub-process of thinning the silicon carbide bulk substrate by polishing the rear surface side of the silicon carbide bulk substrate and then forming an ohmic electrode in the rear surface and a sub-process of performing heat treatment using an optical heating method in which high-power light is irradiated from the rear surface side of the silicon carbide bulk substrate to the ohmic electrode. Therefore, it is possible to prevent the silicon carbide bulk substrate from being damaged and form the ohmic electrode without degrading characteristics of the semiconductor device structure including the electrode or the semiconductor layer even at a high temperature during the heat treatment. As a result, it is possible to manufacture semiconductor devices having excellent device characteristics with a high product yield.

In addition, since the semiconductor device is manufactured according to the manufacturing method of the invention, the semiconductor device has an electrode with an excellent ohmic property and provides excellent device characteristics.

In addition, since the semiconductor apparatus includes the semiconductor device according to the invention, it provides excellent device characteristics.

DETAILED DESCRIPTION OF THE INVENTION

Figure 1:
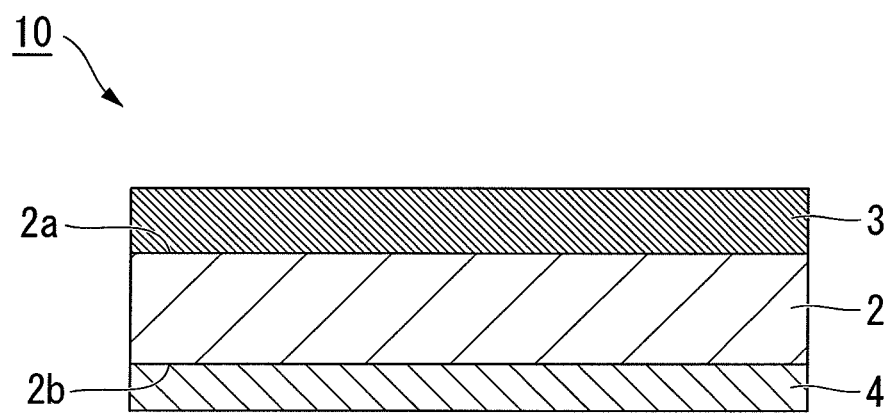
FIG. 1 is a cross-sectional view schematically illustrating an exemplary stack structure of the semiconductor device according to the invention.
Figure 2:
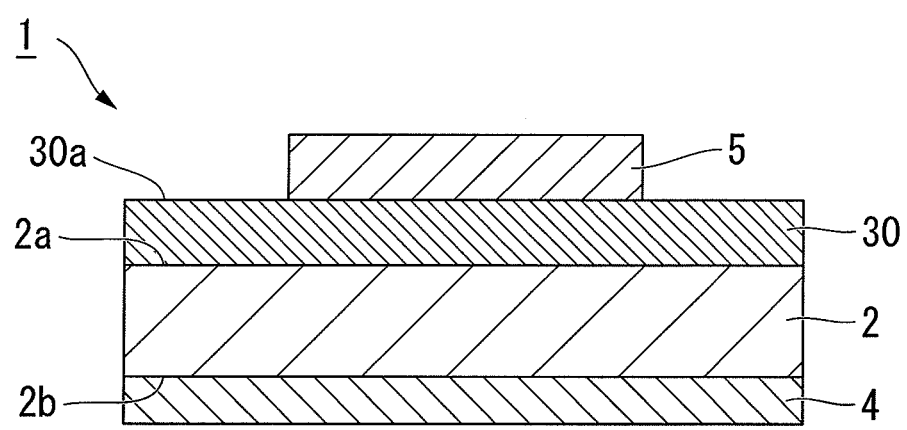
FIG. 2 is a diagram schematically illustrating an exemplary semiconductor device according to the invention showing a cross-sectional view of a Schottky diode.

Hereinafter a method of manufacturing a semiconductor device, a semiconductor device, and a semiconductor apparatus according to embodiments of the invention will be described with reference to the accompanying drawings. FIG. 1 is a schematic cross-sectional view illustrating a stack structure of the semiconductor device 10 according to an embodiment of the invention. FIG. 2 is a schematic cross-sectional view illustrating a Schottky bather diode (semiconductor device) 1 as a semiconductor device according to an embodiment of the invention. FIGS. 3 to 5C are schematic cross-sectional views illustrating a method of manufacturing a semiconductor device 1 of FIG. 2.

The drawings referenced by the following description are used to describe a method of manufacturing a semiconductor device according to the present embodiment, a semiconductor device, and a semiconductor apparatus, in which sizes, thicknesses, dimensions, and the like of each illustrated portion may be different from a dimensional relationship of the semiconductor or the like in practice.

A method of manufacturing a semiconductor device according to the present embodiment sequentially includes a semiconductor device structure formation process in which a semiconductor device structure 3 is formed in the main surface 2a side of a first conduction type (n type according to the present embodiment) silicon carbide bulk substrate 2 including at least a main surface 2a and a rear surface 2b, and an ohmic electrode formation process in which an ohmic electrode 4 making ohmic contact with the silicon bulk substrate 2 is formed in the rear surface 2b side of the silicon carbide bulk substrate 2, wherein the ohmic electrode formation process further sequentially includes a sub-process of thinning the silicon carbide bulk substrate 2 by polishing the rear surface 2b side of the silicon carbide bulk substrate 2 and then forming the ohmic electrode 4 on the rear surface 2b, and a sub-process of performing heat-treatment using an optical heating method in which high-power light is irradiated from the rear surface 2b side of the silicon carbide bulk substrate 2 to the ohmic electrode 4.

Semiconductor Device

Hereinafter, description will be made of a stack structure of the semiconductor device 10 obtained using a method of manufacturing a semiconductor device according to an embodiment of the invention, and a Schottky barrier diode 1 having the semiconductor device 10 according to an embodiment of the invention.

Stack Structure of Semiconductor Device

Referring to FIG. 1, the semiconductor device 10 according to an embodiment of the invention includes an n type silicon carbide bulk substrate 2 having a main surface 2a and a rear surface 2b, a semiconductor device structure 3, formed over the main surface 2a of the silicon carbide bulk substrate 2, including an electric circuit, and an ohmic electrode 4 formed in the rear surface 2b of the silicon carbide bulk substrate 2.

Hereinafter, a stack structure of the semiconductor device 10 will be described in detail.

Silicon Carbide Bulk Substrate (SiC Semiconductor Substrate)

The silicon carbide bulk substrate 2 has an n type characteristic and is a semiconductor substrate made of silicon carbide.

The silicon carbide bulk substrate 2 according to the present embodiment is made from, for example, a low-resistance n+ type 4H-SiC single-crystalline substrate. The silicon carbide bulk substrate 2 preferably has an impurity concentration of $2 \times 10^{18}$ cm$^{-3}$. In addition, the silicon carbide bulk substrate 2 preferably has a thickness of about 350 μm.

Each of the main surface 2a and the rear surface 2b of the silicon carbide bulk substrate 2 used according to the present embodiment may be exposed in any one of, for example, a carbon surface or a silicon surface.

In addition, the rear surface 2b of the silicon carbide bulk substrate 2 according to the present embodiment may be slanted at 0° to 10° from the carbon surface or the silicon surface. In addition, the main surface 2a of the silicon carbide bulk substrate 2 may be slanted at 0° to 10° from the carbon surface or the silicon surface.

Semiconductor Device Structure

A semiconductor device structure 3 of the semiconductor device 10 according to the present embodiment includes an n$^-$ type SiC epitaxial layer grown on the silicon carbide bulk substrate 2 made from the n+ type 4H-SiC single-crystalline substrate described above. The n$^-$ type SiC epitaxial layer of such a semiconductor device structure 3 preferably has an impurity concentration of $1 \times 10^{16}$ cm$^{-3}$. In addition, the semiconductor device structure 3 including the n$^-$ type SiC epitaxial layer preferably has a thickness of about 8 μm.

The n$^-$ type SiC epitaxial layer of the semiconductor device structure 3 has an electric circuit including a plurality of semiconductor areas, for example, formed by implanting aluminum ions or the like into a layer epitaxially grown from the SiC single crystal. The n$^-$ type SiC epitaxial layer of the semiconductor device structure 3 can be used to employ various semiconductor structures as may suit a desired device structure. In addition, as will be described in detail below, the semiconductor device structure 3 may have various electrodes electrically connected to the external side of the device in addition to the electric circuits described above.

Ohmic Electrode

The ohmic electrode 4 according to the present embodiment is provided to make ohmic contact with the rear surface 2b side of the silicon carbide bulk substrate 2. The ohmic electrode 4 may be made of metal capable of making ohmic contact with SiC, for example, metal containing nickel (Ni) as a main component. Alternatively, the ohmic electrode 4 may be made of metal containing Ti, Al, and the like in addition to a single material of nickel.

In addition, the ohmic electrode 4 preferably has a thickness of, but not particularly limited to, about 100 nm.

In the ohmic electrode 4 according to an embodiment of the invention, as will be described in detail below regarding the manufacturing method, heat treatment is performed on the silicon carbide bulk substrate 2 and the ohmic electrode 4 using an optical heating method in which high-power light is irradiated from the rear surface 2b side of the silicon carbide bulk substrate 2. As a result, the ohmic electrode 4 serves as an electrode making excellent ohmic contact with the silicon carbide bulk substrate 2.

Schottky Barrier Diode (Semiconductor Device)

As shown in FIG. 2, the Schottky barrier diode 1 according to the present invention includes: the n type silicon carbide bulk substrate 2 described above; an n$^-$ type SiC epitaxial layer (semiconductor device structure: silicon carbide epitaxial layer) 30 formed over the main surface 2a of the silicon carbide bulk substrate 2, including an electric circuit; a Schottky electrode (semiconductor device structure) 5 formed over the n$^-$ type SiC epitaxial layer 30; and an ohmic electrode 4 formed in the rear surface 2b of the silicon carbide bulk substrate 2.

In comparison with the configuration of the semiconductor device 10 shown in FIG. 1, the Schottky barrier diode 1 according to the present embodiment includes an n type SiC epitaxial layer 30 provided over the main surface 2a of the silicon carbide bulk substrate 2 as a semiconductor device structure, and a Schottky electrode 5 provided thereon.

Schottky Electrode

The Schottky electrode 5 is formed in a predetermined position over the n$^-$ type SiC epitaxial layer 30 as an electrode making Schottky contact with the n$^-$ type SiC epitaxial layer 30.

The Schottky electrode 5 may be made of metal capable of making Schottky contact with SiC, for example, metal containing titanium (Ti) as a main component. In addition, metal used in the Schottky electrode 5 may include Mo, Ni, and the like in addition to Ti as appropriate.

In addition, the Schottky electrode 5 preferably has a thickness of, but not particularly limited to, about 100 nm.

In the Schottky barrier diode 1 according to an embodiment of the invention shown in FIG. 2, as a result of the aforementioned configuration, the ohmic electrode 4 formed in the rear surface 2b of the silicon carbide bulk substrate 2 serves as a cathode. In addition, the Schottky electrode 5 formed over the n$^-$ type SiC epitaxial layer 30 in the main surface 2a side of the silicon carbide bulk substrate 2 serves as an anode.

Other Semiconductor Device

Although the present embodiment exemplifies the Schottky barrier diode described above as a semiconductor device, the semiconductor device of the invention is not limited thereto. For example, in addition to the Schottky barrier diode described above, the semiconductor device structure may be configured using a longitudinal type metal-oxide-semiconductor field-effect transistor (MOSFET), a lateral type MOSFET, a PN diode, and the like. The semiconductor device structure according to the invention is not limited thereto.

Method of Manufacturing Semiconductor Device

As a method of manufacturing a semiconductor device according to the present embodiment, a method of manufacturing the Schottky bather diode (semiconductor device) 1 according to the present embodiment described above will now be described with reference to FIGS. 3 to 5C.

A method of manufacturing the Schottky barrier diode 1 according to the present embodiment sequentially includes a semiconductor device structure formation process in which at least an n$^-$ type SiC epitaxial layer (semiconductor device structure) 30 is formed in the main surface 2a side of the n type silicon carbide bulk substrate 2 having the main surface 2a and the rear surface 2b, and an ohmic electrode formation process in which an ohmic electrode 4 making ohmic contact with the silicon carbide bulk substrate 2 is formed in the rear surface 2b side of the silicon carbide bulk substrate 2, wherein the ohmic electrode formation process sequentially includes a sub-process (1) of thinning the silicon carbide bulk substrate 2 by polishing the rear surface 2b side of the silicon carbide bulk substrate 2 and then forming the ohmic electrode 4 in the rear surface 2b, and a sub-process (2) of performing heat treatment using an optical heating method in which high-power light is irradiated from the rear surface 2b side of the silicon carbide bulk substrate 2 to the ohmic electrode 4.

In the example described according to the present embodiment, the semiconductor device structure formation process sequentially includes at least a sub-process of forming an n⁻ type SiC epitaxial layer (semiconductor device structure:silicon carbide epitaxial layer) 30, including an electric circuit, in the main surface 2a side of the silicon carbide bulk substrate 2 and a sub-process of forming a Schottky electrode 5 making Schottky contact with the if type SiC epitaxial layer 30 over the n⁻ type SiC epitaxial layer 30.

According to the present embodiment, description will be made of an exemplary method of using laser light L as the high-power light in the sub-process (2) of performing heat treatment using an optical heating method in which high-power light is irradiated from the rear surface 2b side of the silicon carbide bulk substrate 2 to the ohmic electrode 4.

Through the manufacturing method according to the present embodiment including each of the aforementioned processes, it is possible to manufacture a top-and-bottom type Schottky barrier diode 1 as shown in FIG. 2.

A method of manufacturing a light-emitting diode according to an embodiment of the invention will now be described in detail.

Semiconductor Device Structure Formation Process

Figure 3:
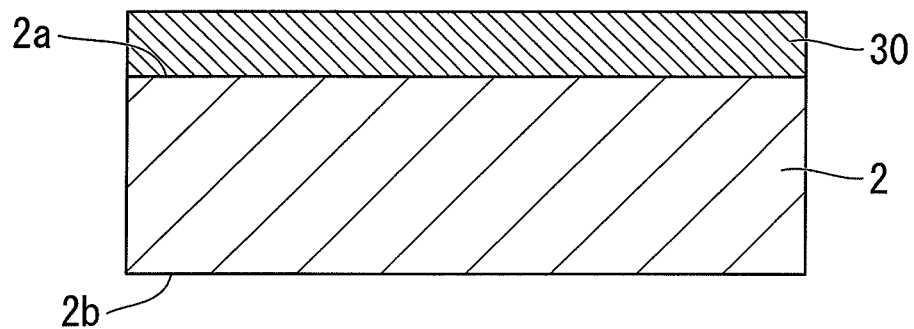
FIG. 3 is a diagram schematically illustrating a method of manufacturing a semiconductor device according to the invention showing a cross-sectional view of a process of manufacturing a Schottky diode.
Figure 4A:
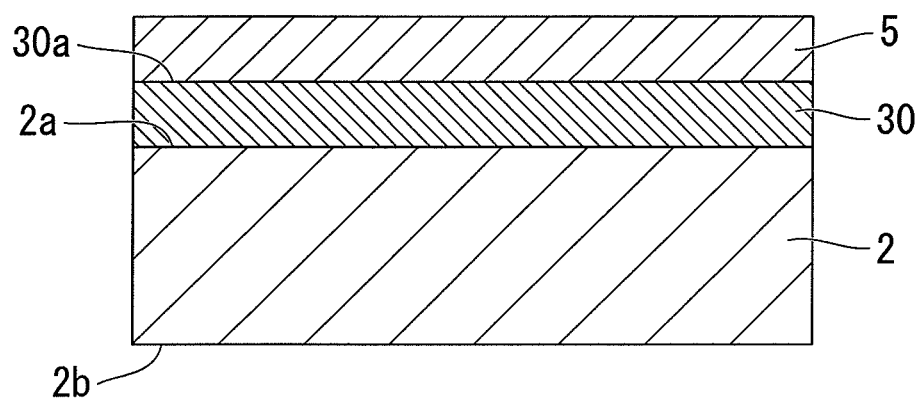
FIG. 4A is a diagram schematically illustrating an exemplary method of manufacturing a semiconductor device according to the invention showing a cross-sectional view of a process of manufacturing a Schottky diode.
Figure 4B:
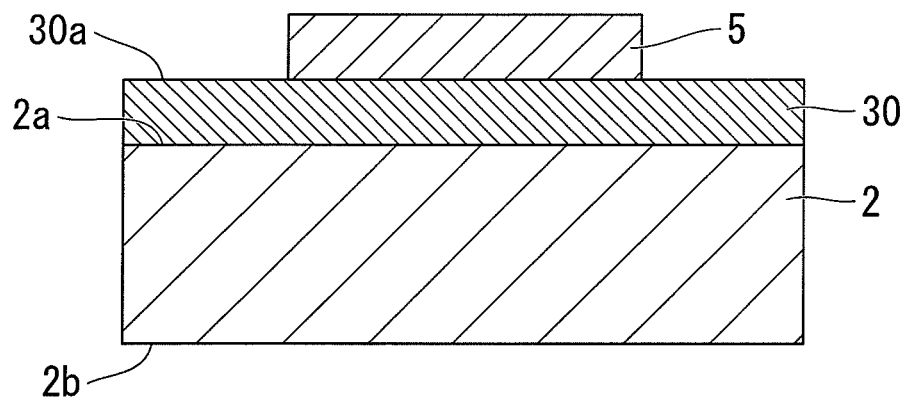
FIG. 4B is a diagram schematically illustrating an exemplary method of manufacturing a semiconductor device according to the invention showing a cross-sectional view of a process of manufacturing a Schottky diode.

In the semiconductor device structure formation process, as shown in FIGS. 3, 4A, and 4B, each layer of the semiconductor device structure is formed over the main surface 2a of the silicon carbide bulk substrate 2. In addition, as described above, the semiconductor device structure formation process according to the present embodiment includes a sub-process of forming an n⁻ type SiC epitaxial layer 30 and a sub-process of forming a Schottky electrode 5.

Sub-process of Forming n Type SiC Epitaxial Layer In the present sub-process, first, a silicon carbide bulk substrate 2 which is made from an n⁺ type 4H-SiC single-crystalline substrate and has a main surface 2a and a rear surface 2b is prepared.

In addition, as shown in FIG. 3, an n⁻ type SiC epitaxial layer 30 made from an n⁻ type SiC single-crystalline growth layer is formed in the main surface 2a of the silicon carbide bulk substrate 2, for example, using a CVD method. In the present sub-process, as a film formation condition for forming the n⁻ type SiC epitaxial layer 30, any condition known by those skilled in the art in the field of semiconductors may be used without limitation.

Sub-Process of Forming Schottky Electrode

Next, in the present sub-process, the Schottky electrode 5 making Schottky contact with the n⁻ type SiC epitaxial layer 30 is formed over the n⁻ type SiC epitaxial layer 30.

Specifically, as shown in FIG. 4A, first, metal capable of making Schottky contact with SiC single-crystal, for example, metal containing Ti as a main component, Mo, Ni, or the like is deposited in the surface 30a of then⁻ type SiC epitaxial layer 30 as a thin film using a sputtering method or the like. In this case, the deposition process is performed such that the Schottky electrode 5 including the aforementioned thin film over the n⁻ type SiC epitaxial layer 30 has a thickness of about 100 nm.

In addition, as a method of depositing the metal on the surface 30a of the n⁻ type SiC epitaxial layer 30, other methods such as an electron beam deposition method may be used in addition to the sputtering.

Next, as shown in FIG. 4B, in order to allow the Schottky electrode 5 to have a necessary size as a semiconductor device, the Schottky electrode 5 is processed to have a desired size using a lift-off method, an etching method, and the like.

Next, heat treatment is performed on the Schottky electrode 5 to process an electrode having a desired height of the Schottky barrier. As a heat treatment method in this case, for example, rapid thermal annealing (RTA) may be used. In this case, although the RTA condition may be differently set depending on a target height of the Schottky barrier, a type of the electrode metal, or the like, the RTA may be typically performed under an argon atmosphere at a temperature of 600 to 700° C. for 3 to 60 minutes.

Although, in the exemplary semiconductor device structure formation process according to the present embodiment, description has been made of an example of forming the semiconductor device structure in a case where the Schottky barrier diode 1 is manufactured through each sub-process described above, the method of manufacturing the semiconductor device according to the invention is not limited thereto. For example, the manufacturing method according to the present invention may be applied without limitation even to a case where a longitudinal type MOSFET structure, a lateral type MOSFET structure, a PN type diode structure, or the like is formed as described above.

Ohmic Electrode Formation Process

Next, in the ohmic electrode formation process, the ohmic electrode 4 making ohmic contact with the silicon carbide bulk substrate 2 is formed in the rear surface 2b side of the silicon carbide bulk substrate 2. The ohmic electrode formation process described according to the present embodiment sequentially includes a sub-process (1) of thinning the silicon carbide bulk substrate 2 by polishing the rear surface 2b side of the silicon carbide bulk substrate 2 and then forming the ohmic electrode 4 in the rear surface 2b and a sub-process (2) of performing heat treatment on the silicon carbide bulk substrate 2 and the ohmic electrode 4 using an optical heating method in which laser light (high-power light) L is irradiated from the rear surface 2b side of the silicon carbide bulk substrate 2.

Sub-Process (1)

First, in the sub-process (1), as described above, the thickness of the silicon carbide bulk substrate 2 is reduced by polishing the rear surface 2b side of the silicon carbide bulk substrate 2, and then, the ohmic electrode 4 is formed in the rear surface 2b.

Figure 5A:
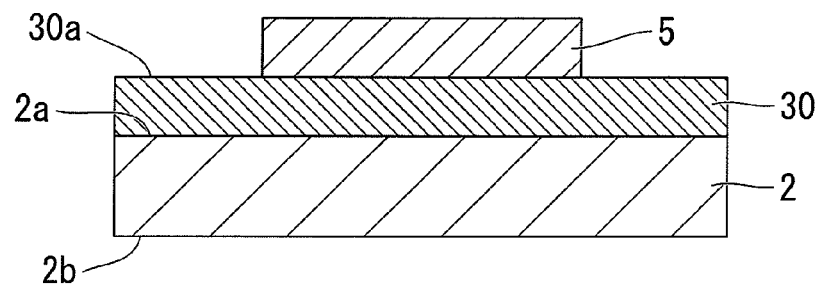
FIG. 5A is a diagram schematically illustrating an exemplary method of manufacturing a semiconductor device according to the invention showing a cross-sectional view of a process of manufacturing a Schottky diode.

Specifically, as shown in FIG. 5A, first, the silicon carbide bulk substrate 2 is processed such that the thickness thereof is reduced to about 100 μm by polishing the rear surface 2b side of the silicon carbide bulk substrate 2 using a diamond abrasive grain method or the like. In this case, the thickness of the silicon carbide bulk substrate 2 resulting from the polishing is preferably reduced to be as thin as possible from the viewpoint of reduction of thermal resistance or electric resistance in the semiconductor device. However, if the silicon carbide bulk substrate 2 is too thin, treatment in each process followed by the polishing becomes difficult. Therefore, it is preferably set to a thickness of about 50 to 100 μm.

In addition, the method of polishing the rear surface 2b of the silicon carbide bulk substrate 2 is not limited to the diamond abrasive grain method described above. For example, a mechanical chemical polishing method may be used as appropriate.

Figure 5B:
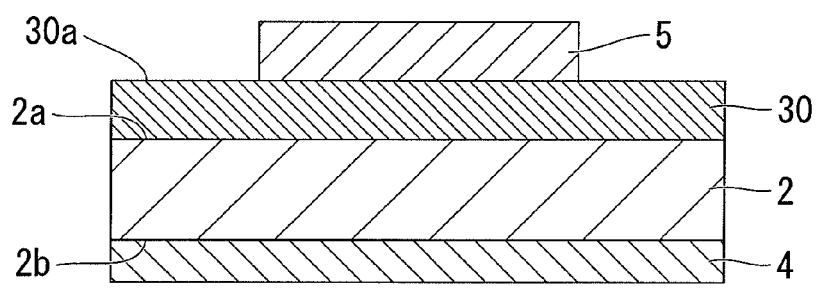
FIG. 5B is a diagram schematically illustrating an exemplary method of manufacturing a semiconductor device according to the invention showing a cross-sectional view of a process of manufacturing a Schottky diode.

Next, as shown in FIG. 5B, the ohmic electrode 4 is formed in the rear surface 2b of the silicon carbide bulk substrate 2 thinned by the polishing.

Specifically, as shown in FIG. 5B, metal capable of making ohmic contact with SiC, for example, metal containing Ni as a main component is deposited on the rear surface 2b of the silicon carbide bulk substrate 2. More specifically, for example, metal containing Ti, Al, and the like in addition to a single material of nickel is deposited on the rear surface 2b of the silicon carbide bulk substrate 2 using a sputtering method or the like. In this case, the film deposition process is performed such that the ohmic electrode 4 has a thickness of about 100 nm on the rear surface 2b of the silicon carbide bulk substrate 2.

In addition, a deposition method or the like other than the sputtering method may be used to deposit the ohmic electrode 4 made of the aforementioned metal on the rear surface 2b of the silicon carbide bulk substrate 2.

Sub-Process (2)

Next, in the sub-process (2), as described above, heat treatment is performed using an optical heating method in which high-power light is irradiated from the rear surface 2b side of the silicon carbide bulk substrate 2 to the ohmic electrode 4.

Figure 5C:
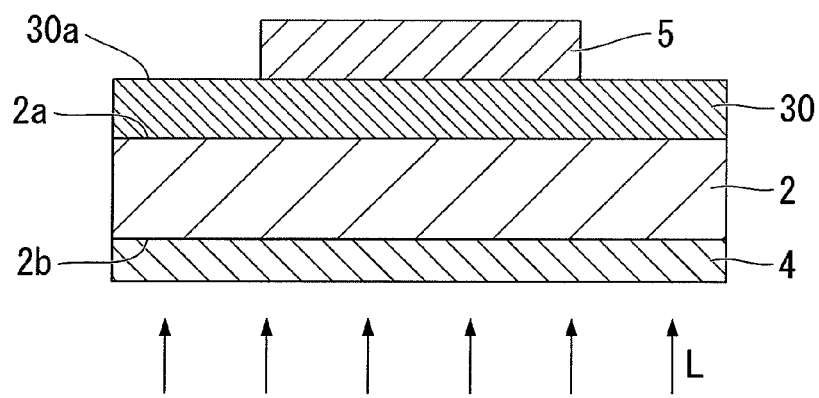
FIG. 5C is a diagram schematically illustrating an exemplary method of manufacturing a semiconductor device according to the invention showing a cross-sectional view of a process of manufacturing a Schottky diode.
Figure 6A:
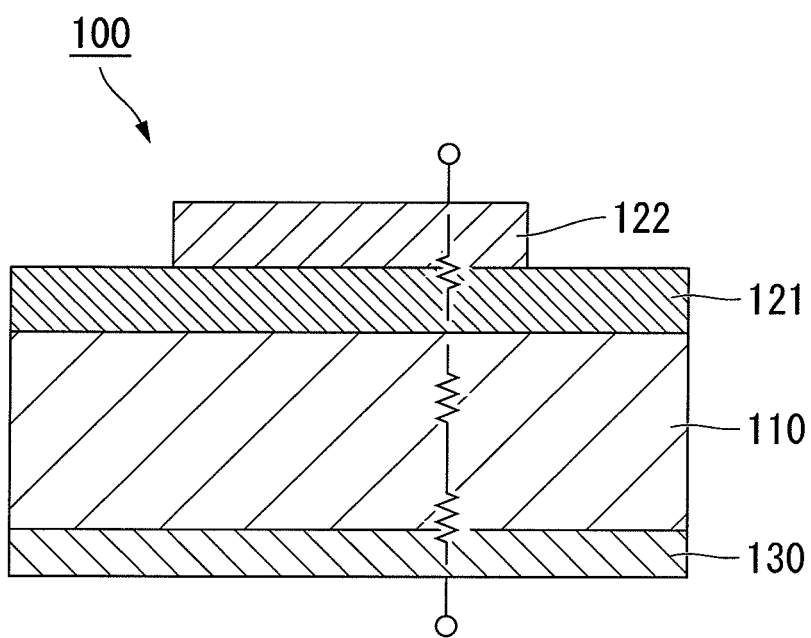
FIG. 6A is a cross-sectional view schematically illustrating a semiconductor device in the related art.
Figure 6B:
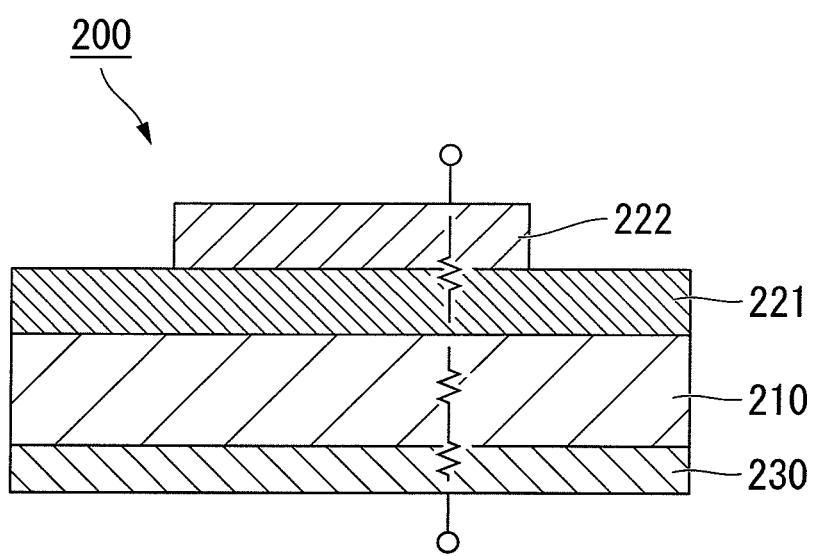
FIG. 6B is a cross-sectional view schematically illustrating a semiconductor device in the related art.

Specifically, as shown in FIG. 5C, laser light L is irradiated as the high-power light to the ohmic electrode 4 from the rear surface 2b side of the silicon carbide bulk substrate 2.

In the sub-process (2) of performing heat treatment of the ohmic electrode formation process according to the present embodiment, laser light is preferably used as the high-power light when the ohmic electrode 4 and the silicon carbide bulk substrate 2 are optically heated. In addition, out of laser light sources, excimer laser is preferably used.

Although the polishing process of the rear surface 2b side of the silicon carbide bulk substrate 2 in the aforementioned sub-process (1) is performed using a diamond abrasive grain method or the like, the rear surface 2b resulting from the polishing may suffer from polishing flaws remaining throughout the entire area, which may cause unevenness. If the surface roughness (rms) of the silicon carbide bulk substrate resulting from such a polishing is measured using an atomic force microscope (AMF) method, for example, it may reach several micrometers. In a case where, for example, 100 nm of Ni is deposited for an electrode on such an uneven surface of the silicon carbide bulk substrate, a portion having a partially thinner thickness or a portion that is not bonded to the surface of the silicon carbide bulk substrate may occur.

In a case where, for example, laser light having a wavelength of energy smaller than the band gap of SiC is irradiated to the electrode on such a silicon carbide bulk substrate, the laser light is transmitted through the silicon carbide bulk substrate from a thin portion of the electrode or a portion not bonded to the electrode. For this reason, the semiconductor device structure over the silicon carbide bulk substrate may be heated by the laser light, and a critical defect may occur.

In order to prevent the aforementioned problem, it is effective to select a wavelength of energy equal to or higher than the band gap of the silicon carbide (SiC) as a wavelength of laser light used in the high-power light. For example, the silicon carbide bulk substrate made of 6H-SiC single crystals has a band gap of about 3 eV, which corresponds to a wavelength $\lambda = h \cdot c / Eg = 1.24/3 = 0.41$ μm. Therefore, a laser wavelength equal to or lower than 0.41 μm is difficult to transmit through SiC. For example, it is effective to use an excimer laser (ArF excimer laser: a wavelength of 193 nm, XeCl excimer laser: a wavelength of 308 nm, XeF excimer laser: a wavelength of 351 nm). If the wavelength of the laser light is too short, it is difficult to convert the absorbed light energy into thermal energy. In addition, a wavelength shorter than 190 nm produces some problems such as much absorption of moisture or oxygen within the air. Therefore, according to the present embodiment, laser light having a wavelength shorter than 190 nm is not appropriate. In addition, it is difficult to convert the laser light having a further shorter wavelength into thermal energy, and the size of the apparatus increases. However, since it may reduce absorption of oxygen or moisture within the air caused by laser light having a short wavelength, dry air, nitrogen gas, or argon gas may be used as atmospheric air.

In order to obtain excellent ohmic contact between the ohmic electrode 4 and the silicon carbide bulk substrate 2, an interface between the ohmic electrode 4 and the silicon carbide bulk substrate 2 may be diffused and alloyed. For this reason, it is necessary to use high-power laser light, for example, an excimer laser such as ArF excimer laser, XeCl excimer laser, and XeF excimer laser as described above.

Furthermore, in order to obtain excellent ohmic contact between the ohmic electrode 4 and the silicon carbide bulk substrate 2, energy of the laser light L used in the optical heating method preferably has an irradiation energy density per pulse equal to or higher than 10 mJ/cm$^2$. Furthermore, in a case where an irradiation energy density per pulse is set to 10 mJ/cm$^2$, the energy density of the laser light L is preferably set to about 0.1 to 2 J/cm$^2$ by setting the number of pulses to 100 to 200.

In addition, a suitable value of the energy density of the laser light L varies depending on a conduction type (n or p type) of the silicon carbide bulk substrate, a type of metal used in the electrode, a thickness of the electrode, and the like. For example, in a case where a p type silicon carbide bulk substrate and an Ni electrode having a thickness of 1000 angstroms are used, and the irradiation energy density per one pulse is set to 10 mJ/cm$^2$, an excellent ohmic property can be obtained by using laser light L having a number of pulses of 40 to 150 and an energy density of about 0.4 to 1.5 J/cm$^2$.

In a case where the heat treatment time period using the laser light L increases, the ohmic property is improved as a temperature of the ohmic electrode 4 increases. However, due to thermal conduction, temperatures of the n$^-$ type SiC epitaxial layer 30 and the Schottky electrode 5 formed in the main surface 2a side of the silicon carbide bulk substrate 2 also increase. Here, in a case where a semiconductor device structure includes a MOSFET or a Schottky device, heat treatment is performed at a respective optimal temperature. For this reason, as the semiconductor device structure is heated to a heat treatment temperature or higher, device characteristics of the semiconductor device structure may be degraded. Such degradation may become serious as a time period maintained at a high temperature increases.

In this regard, according to the present embodiment, in a case where high-power light such as laser light is irradiated from the rear surface 2b side of the silicon carbide bulk substrate 2, it is necessary to prevent degradation of the device characteristics caused by excessive temperature increase of the semiconductor device structure in the main surface 2a side. Specifically, for example, the following method can be employed.

First, in order to prevent excessive temperature increase of the semiconductor device structure in the main surface 2a side, it is effective to reduce an irradiation time period of the laser light (high-power light) L to be as short as possible. For this purpose, according to the present embodiment, the pulse irradiation is preferably used in the laser light L irradiation. Furthermore, it is preferable that an irradiation time per pulse is set to 10 μsec or shorter, and a pulse irradiation interval is set to 1 msec or longer, when pulses of the laser light L are irradiated to any point in the rear surface 2b side of the silicon carbide bulk substrate 2. In addition, according to the present embodiment, it is preferable that the irradiation time period (a laser irradiation time period including the irradiation time per pulse and the pulse irradiation interval) of the laser light L is set to 1 sec or shorter.

An optimal irradiation time period for irradiating high-power light such as laser light to the ohmic electrode 4 depends on the thermal resistance, that is, the thickness of the silicon carbide bulk substrate 2. For example, as the substrate thickness decreases, the optimal irradiation time period decreases. For this reason, pulse irradiation is preferably used in the irradiation of the laser light L. In addition, in a case where the substrate has a thickness of about 100 the irradiation time per pulse is preferably set to 10 μsec or shorter. In this case, the pulse irradiation interval is preferably set to 1 msec or longer.

In addition, according to the present embodiment, the pulse cycle (pulse irradiation interval) for irradiating pulses of the laser light (high-power light) L is preferably set to 5 msec or longer, and more preferably, to 10 msec or longer.

In addition, in a case where excimer laser light is used, the irradiation energy density is preferably set to 10 mJ/cm$^2$ or higher, the irradiation time per pulse is preferably set to 50 nsec or shorter, or the pulse cycle is preferably set to 5 msec or longer. Furthermore, the irradiation energy density per pulse is preferably set to 10 mJ/cm$^2$ or higher, the irradiation time per pulse is preferably set to 50 nsec or shorter, and the pulse cycle is preferably set to 5 msec or longer. Moreover, the irradiation energy density per pulse is preferably set to 10 mJ/cm$^2$ or higher, the irradiation time per pulse is preferably set to 30 nsec or shorter, and the pulse cycle is preferably set to 10 msec or longer. In a case where excimer laser light is used, the output of the excimer laser light rises from several nanoseconds to several tens of nanoseconds, thermal radiation is observed from a sample obtained from about 10 nsec after incidence, the area having a depth of several tens of nanometers is heated, and the laser light is decayed within several tens of nanoseconds. For this reason, if high-energy laser light is irradiated within a short time period, for example, if pulse laser light having a pulse irradiation interval of 10 nsec is irradiated to the ohmic electrode 4, only the vicinity of the surface including the ohmic electrode 4 is instantaneously heated and alloyed so that it is possible to obtain an excellent ohmic property. Therefore, it is possible to obtain excellent ohmic contact and reduce unreacted carbon by forming a thin silicide alloy layer at the interface between the ohmic electrode 4 and the silicon carbide bulk substrate 2 after forming a significantly thin ohmic electrode 4.

Here, when the ohmic contact is formed by performing heat treatment, as a method of the related art, in the ohmic electrode having a typically conventional thick film, unreacted carbon is significantly generated at the interface between the ohmic electrode and the silicon carbide bulk substrate. For this reason, problems such as electrode exfoliation or series resistance increase may occur.

In comparison, since the manufacturing method according to the present embodiment employs the aforementioned heat treatment method, excellent ohmic contact is provided between the ohmic electrode 4 and the silicon carbide bulk substrate 2, and problems such as electrode exfoliation or series resistance increase do not occur.

According to the present embodiment, the sub-process (2) for performing heat treatment is preferably carried out while at least one of the light source of the laser light L as the high-power light or the silicon carbide bulk substrate 2 is linearly or rotatably moved. If the heat treatment of the ohmic electrode 4 is performed through such a method, the laser light L is not irradiated to the same portion for a long time period. Therefore, it is possible to suppress heat from transferring to the internal side of the silicon carbide bulk substrate 2 as described above, and prevent the semiconductor device structure from being damaged.

In addition, in order to control the irradiation level of the laser light L, it is possible to employ methods of changing, for example, a laser light projection area, a laser light incidence direction, a laser light scan speed, a substrate moving speed, or the like in addition to the aforementioned method.

For example, according to the present embodiment, at least one of a light-emission shape of the laser light L as the high-power light or an irradiation shape of the laser light L on the ohmic electrode 4 preferably has a noncircular shape. If any one of the light emission shape or the irradiation shape of the laser light L has a noncircular shape, it is possible to suppress heat from transferring to the internal side of the silicon carbide bulk substrate 2, and prevent the semiconductor device structure from being damaged in the main surface 2a side.

Here, the noncircular shape described herein generally includes various shapes such as a rectangular shape or an elliptical shape.

In addition, according to the present embodiment, the irradiation angle of the laser light L as the high-power light is preferably set to less than 90° relative to the silicon carbide bulk substrate 2 or the ohmic electrode 4. If the silicon carbide bulk substrate 2 of the laser light L or the irradiation angle relative to the ohmic electrode 4 is set to the range described above, it is possible to suppress heat from transferring to the internal side of the silicon carbide bulk substrate 2, and prevent the semiconductor device structure from being damaged.

Furthermore, according to the present embodiment, the sub-process (2) for heat treatment may be performed by cooling at least the main surface 2a side of the silicon carbide bulk substrate 2 to lower the temperature of the main surface 2a side to less than that of the rear surface 2b side. Specifically, a heat sink having a large heat capacity may be connected to the main surface 2a side of the silicon carbide bulk substrate 2. If the heat treatment of the ohmic electrode 4 is performed using such a method, it is possible to suppress a high-temperature heat caused by the laser light L from transferring from the rear surface 2b side to the main surface 2a side of silicon carbide bulk substrate 2. Therefore, it is possible to prevent the semiconductor device structure formed in the main surface 2a side of the silicon carbide bulk substrate 2 as described above from being damaged.

In addition, if the temperature of the silicon carbide bulk substrate 2 before irradiating the laser light L is reduced to be as low as possible, it is preferable because it is possible to suppress a high-temperature heat from transferring to the internal side of the silicon carbide bulk substrate 2, and suppress a temperature of the semiconductor device structure from increasing.

In addition, in a case where the heat treatment is performed by irradiating high-power laser light L to the ohmic electrode, an irradiated portion of the electrode material may be evaporated or molten and re-crystallized so that the surface morphology may be degraded.

In order to prevent such a problem, in the sub-process (2) for heat treatment included in the ohmic electrode formation process according to the present embodiment, the heat treatment using the laser light L is preferably performed after depositing a film having a high transmittance for the laser light L on the ohmic electrode 4. Specifically, for example, the heat treatment may be performed, for example, by depositing an $SiO_2$ film having a thickness of about 1 µm on the ohmic electrode 4 using a CVD method or a sputtering method and then irradiating laser light L to the ohmic electrode 4 through the $SiO_2$ film. If the heat treatment of the ohmic electrode 4 is performed using such a method, it is possible to effectively prevent loss of the electrode material caused by evaporation or degradation of the surface morphology caused by melting and re-crystallization.

According to the present embodiment, through each process described above, the semiconductor device structure is formed on the main surface 2a of the silicon carbide bulk substrate 2, the rear surface 2b of the silicon carbide bulk substrate 2 is thinned by the polishing, the ohmic electrode 4 is formed in the rear surface 2b, and then the heat treatment is performed using high-power light. In this manner, if the rear surface 2b side is polished after forming the semiconductor device structure in the main surface 2a side of the silicon carbide bulk substrate 2, it is possible to prevent the silicon carbide bulk substrate 2 from being damaged. Therefore, it is possible to improve a product yield for manufacturing semiconductor devices such as the Schottky barrier diode 1. Since the thermal resistance inside the silicon carbide bulk substrate 2 is reduced by forming the silicon carbide bulk substrate 2 with a thin thickness, a cooling performance is improved when the heat treatment on the ohmic electrode 4 is performed, and a series resistance inside the semiconductor device is reduced so that device characteristics are improved. Therefore, it is possible to improve both the product yield for manufacturing the semiconductor devices and characteristics of the semiconductor devices.

Dividing and Unitizing Process

Next, in the manufacturing method according to the present embodiment, the semiconductor wafer obtained through each of the aforementioned processes is cut, for example, using a dicing method, a scribing method, or a laser and divided into individual chips so that unitized Schottky barrier diodes (semiconductor device) 1 are obtained.

Specifically, a chip-shaped Schottky barrier diode 1 is obtained by cutting the silicon carbide bulk substrate 2, for example, using a dicing saw to form a desired shape as seen in a plan view such as a square or rectangular shape having a predetermined dimension.

The method of manufacturing the Schottky barrier diode 1 as an embodiment of the semiconductor device according to the invention described above sequentially includes at least a semiconductor device structure formation process in which a semiconductor device structure (an n⁻ type SiC epitaxial layer 30 and a Schottky electrode 5) is formed in the main surface 2a side of the silicon carbide bulk substrate 2, and an ohmic electrode formation process in which an ohmic electrode 4 making ohmic contact with the silicon carbide bulk substrate 2 is formed in the rear surface 2b side of the silicon carbide bulk substrate 2, wherein the ohmic electrode formation process sequentially includes a sub-process (1) of reducing a thickness of the silicon carbide bulk substrate 2 by polishing the rear surface 2b side of the silicon carbide bulk substrate 2 and then forming an ohmic electrode 4 in the rear surface 2b, and a sub-process (2) of performing heat treatment using an optical heating method in which laser light L as high-power light is irradiated from the rear surface 2b side of the silicon carbide bulk substrate 2 to the ohmic electrode 4. Therefore, it is possible to prevent damage to the silicon carbide bulk substrate 2 and form the ohmic electrode 4 without degrading characteristics of the semiconductor device structures including the electrode or the semiconductor layer even at a high temperature during the heat treatment. As a result, it is possible to manufacture the Schottky barrier diode 1 having excellent device characteristics with a high product yield.

The Schottky barrier diode 1 as an embodiment of the semiconductor device according to the invention is manufactured using a manufacturing method according to the present embodiment. Therefore, it is possible to provide an electrode having an excellent ohmic property and provide an excellent device characteristic.

Semiconductor Apparatus

A semiconductor apparatus using the Schottky barrier diode (semiconductor device) according to the present embodiment described above may include, for example, a switching power source apparatus or an inverter apparatus. Here, a switching power source apparatus receives a DC voltage to raise or lower the voltage and outputs a DC voltage with an excellent quality by improving voltage conversion efficiency. In addition, the inverter apparatus generates an AC power source from a DC power source.

EXAMPLES

Although a method of manufacturing a semiconductor device, a semiconductor device, and a semiconductor apparatus according to the invention will now be described in more detail based on the following examples, such examples are not intended to limit the invention.

In the present example, as the semiconductor device according to the invention, a Schottky barrier diode 1 having the Schottky electrode structure shown in FIG. 2 was manufactured.

Formation of Semiconductor Device Structure (Semiconductor Device Structure Formation Process)

First, a silicon carbide bulk substrate 2 which is made of n⁺ type 4H-SiC single-crystalline substrate and has a main surface 2a and a rear surface 2b was prepared.

As shown in FIG. 3, an n⁻ type SiC epitaxial layer 30 made from an n⁻ type SiC single-crystalline growth layer was formed in the main surface 2a of the silicon carbide bulk substrate 2 using a CVD method under a typical film formation condition.

Next, as shown in FIG. 4A, metal containing titanium Ti as a main component as metal capable of making Schottky contact with SiC single crystals was deposited on the surface 30a of the n⁻ type SiC epitaxial layer 30 using a sputtering method as a thin film. In this case, the Schottky electrode 5 made from the aforementioned thin film was deposited on the n⁻ type SiC epitaxial layer 30 to have a thickness of about 100 nm.

Next, as shown in FIG. 4B, the Schottky electrode 5 was processed to have a desired size as the Schottky barrier diode using a lift-off method.

Next, heat treatment was performed on the Schottky electrode 5 through rapid thermal annealing (RTA) so that an electrode having a desired Schottky barrier height was manufactured. In this case, a high-impurity argon gas was used as the atmospheric gas.

Formation of Ohmic Electrode (Ohmic Electrode Formation Process)

Next, as shown in FIG. 5A, the silicon carbide bulk substrate 2 was thinned to have a thickness of about 100 µm by polishing the rear surface 2b side of the silicon carbide bulk substrate 2 using a diamond abrasive grain method.

Next, as shown in FIG. 5B, Ni as metal capable of making ohmic contact with SiC was deposited on the rear surface 2b of the thinned silicon carbide bulk substrate 2. In this case, the ohmic electrode 4 was deposited on the rear surface 2b of the silicon carbide bulk substrate 2 to have a thickness of about 100 nm.

Next, as shown in FIG. 5C, heat treatment (annealing) was performed using an optical heating method by irradiating excimer laser light (laser light L) from the rear surface 2b side of the silicon carbide bulk substrate 2 to the ohmic electrode 4. In this case, as the excimer laser light, XeCl excimer laser having a wavelength of 308 nm and an irradiation energy density per pulse of 0.1 $J/cm^2$ was used. In addition, considering that the silicon carbide bulk substrate 2 has a thickness of about 100 μm, the irradiation time per pulse was set to about 20 nsec, and the pulse cycle (pulse irradiation interval) was set to 10 msec, and the number of pulses was set to 10. As a result, it was recognized that excellent ohmic contact can be obtained between the ohmic electrode 4 and the silicon carbide bulk substrate 2. In addition, it was recognized that there is no characteristic change in the Schottky electrode 5 and the $n^-$ type SiC epitaxial layer 30 as the semiconductor device structure in the main surface 2a side of the silicon carbide bulk substrate 2 before and after the heat treatment performed in the rear surface 2b side.

In addition, another sample was manufactured by further polishing the rear surface 2b side of the silicon carbide bulk substrate 2 to form a silicon carbide bulk substrate 2 having a thickness of 50 μm, forming the ohmic electrode 4 in the rear surface 2b side of the silicon carbide bulk substrate 2 as described above, and performing heat treatment. In this case, the XeCl excimer laser having the same wavelength and the same energy density as those described above was used as the laser light L used in the heat treatment, the pulse width (irradiation time per pulse) was set to 20 nsec, the irradiation interval was set to 25 msec, and the number of times of irradiation was set to 40. As a result, it was recognized that excellent ohmic contact can be obtained between the ohmic electrode 4 and the silicon carbide bulk substrate 2 even in a case where the silicon carbide bulk substrate 2 has a thickness of 50 μm.

As described above, in the polishing process performed using a diamond abrasive grain method or the like for the rear surface 2b side of the silicon carbide bulk substrate 2, polishing flaws remain in the entire area of the rear surface 2b after the polishing so that an uneven state is obtained. For this reason, in the rear surface 2b of the silicon carbide bulk substrate 2, a thin portion of Ni metal included in the ohmic electrode 4 or a portion not bonded to the electrode is generated. According to the present embodiment, it was recognized that excellent ohmic contact is made between the ohmic electrode 4 and the silicon carbide bulk substrate 2 by performing the heat treatment on the ohmic electrode 4 described above using an XeCl excimer laser having a wavelength of 308 nm and an energy density of 1.0 $J/cm^2$.

In addition, since 6H-SiC included in the silicon carbide bulk substrate 2 has a band gap of about 3 eV, which corresponds to a wavelength $\lambda = h \cdot c/Eg = 1.24/3 = 0.41$ μm, hardly any of the irradiated XeCl excimer laser is transmitted through the silicon carbide bulk substrate 2. As a result, it is envisaged that there is no characteristic change in the Schottky electrode 5 and the $n^-$ type SiC epitaxial layer 30 in the main surface 2a side of the silicon carbide bulk substrate 2 before and after the heat treatment performed in the rear surface 2b side.

In addition, for the same sample as that described above, an $SiO_2$ film having a thickness of 1 μm was deposited on the ohmic electrode 4 using a CVD method, heat treatment was performed by interposing the $SiO_2$ film using an XeCl excimer laser under the same condition as that described above, and then, the $SiO_2$ film was removed through etching using an oxidation solution. As a result, it was recognized that excellent ohmic contact is made between the ohmic electrode 4 and the silicon carbide bulk substrate 2 without degrading the morphology of the ohmic electrode 4.

Dividing and Unitizing

Next, the silicon carbide bulk substrate 2 was cut in square or rectangular shapes having a predetermined dimension using a dicing saw to provide a desired shape as seen in a plan view and unitized into chips of the Schottky barrier diodes 1.

Through the examples described above, it is apparent that the method of manufacturing a semiconductor device according to the invention can reduce both the thermal resistance (capable of improving a cooling performance) and the series resistance (capable of reducing an ON-voltage) by thinning the silicon carbide bulk substrate. In addition, since it is possible to prevent the silicon carbide bulk substrate from being damaged by polishing the rear surface side after forming the semiconductor device structure in the main surface side of the silicon carbide bulk substrate, it is apparent that a product yield for manufacturing the semiconductor devices such as a Schottky barrier diode is improved.

Consequently, it is apparent that, using the method of manufacturing a semiconductor device according to the invention, it is possible to form an electrode having an excellent ohmic property and manufacture semiconductor devices having excellent device characteristics with a high product yield. In addition, it is apparent that the semiconductor device obtained through the aforementioned manufacturing method has an excellent ohmic property in the electrode and excellent device characteristics.

INDUSTRIAL APPLICABILITY

The invention relates to a method of manufacturing a semiconductor device, a semiconductor device, and a semiconductor apparatus. It is possible to remarkably improve a product yield and device characteristics of the semiconductor device using the silicon carbide bulk substrate. Therefore, the invention can be applied to industrial fields for manufacturing semiconductor devices and the like.

REFERENCE SIGNS LIST

1 SCHOTTKY BARRIER DIODE (SEMICONDUCTOR DEVICE)
10 SEMICONDUCTOR DEVICE
2 SILICON CARBIDE BULK SUBSTRATE
2a MAIN SURFACE (SILICON CARBIDE BULK SUBSTRATE)
2b REAR SURFACE (SILICON CARBIDE BULK SUBSTRATE)
3 Semiconductor Device Structure
30 $n^-$ TYPE SiC EPITAXIAL LAYER (SEMICONDUCTOR DEVICE STRUCTURE)
4 OHMIC ELECTRODE
5 SCHOTTKY ELECTRODE (SEMICONDUCTOR DEVICE STRUCTURE)
L LASER LIGHT (HIGH-POWER LIGHT)

The invention claimed is:

1. A method of manufacturing a semiconductor device, the method sequentially comprising:
a semiconductor device structure formation process in which a semiconductor device structure is partially or wholly formed at least in a main surface side of a first conduction type silicon carbide bulk substrate having a main surface and a rear surface; and an ohmic electrode formation process in which an ohmic electrode making ohmic contact with the silicon carbide bulk substrate is formed in the rear surface side of the silicon carbide bulk substrate, wherein the ohmic electrode formation process sequentially includes a sub-process of thinning the silicon carbide bulk substrate by polishing the rear surface side of the silicon carbide bulk substrate and then forming the ohmic electrode in the rear surface; and a sub-process of performing heat treatment using an optical heating method in which high-power light is irradiated from the rear surface side of the silicon carbide bulk substrate to the ohmic electrode, wherein the sub-process of performing heat treatment of the ohmic electrode formation process is carried out by lowering a temperature of the main surface side to be less than a temperature of the rear surface side by cooling at least the main surface side of the silicon carbide bulk substrate.

2. The method according to claim 1, wherein the high-power light is laser light.

3. The method according to claim 2, wherein the laser light is excimer laser light.

4. The method according to claim 1, wherein, in the sub-process of performing heat treatment of the ohmic electrode formation process, the high-power light is irradiated in pulses.

5. The method according to claim 4, wherein, in the sub-process of performing heat treatment of the ohmic electrode formation process, an irradiation energy density per pulse for irradiating the high-power light in pulses is set to 10 mJ/cm$^2$ or higher.

6. The method according to claim 4, wherein, in the sub-process of performing heat treatment of the ohmic electrode formation process, an irradiation time per pulse for irradiating the high-power light in pulses is set to 10 μsec or shorter.

7. The method according to claim 4, wherein in the sub-process of performing heat treatment of the ohmic electrode formation process, a pulse cycle for irradiating the high-power light in pulses is set to 5 msec or longer.

8. The method according to claim 1, wherein the sub-process of performing heat treatment of the ohmic electrode formation process is carried out while at least one of the high-power light or the silicon carbide bulk substrate is linearly or rotatably moved.

9. The method according to claim 1, wherein, in the sub-process of performing heat treatment of the ohmic electrode formation process, an irradiation time period of the high-power light at an arbitrary point in the rear surface side of the silicon carbide bulk substrate is set to one second or shorter.

10. The method according to claim 1, wherein, in the sub-process of performing heat treatment of the ohmic electrode formation process, at least any one of a light emission shape of the high-power light or an irradiation shape of the high-power light on the ohmic electrode has a noncircular shape.

11. The method according to claim 1, wherein, in the sub-process of performing heat treatment of the ohmic electrode formation process, an irradiation angle of the high-power light is set to less than 90° relative to the silicon carbide bulk substrate.

12. The method according to claim 1, wherein the rear surface of the silicon carbide bulk substrate is slanted at 0° to 10° from a carbon surface or a silicon surface.

13. The method according to claim 1, wherein the main surface of the silicon carbide bulk substrate is slanted at 0° to 10° from a carbon surface or a silicon surface.

14. The method according to claim 1, wherein the semiconductor device structure formation process sequentially includes a sub-process of forming a silicon carbide epitaxial layer at least in the main surface side of the silicon carbide bulk substrate, and a sub-process of forming a Schottky electrode making Schottky contact with the silicon carbide epitaxial layer over the silicon carbide epitaxial layer.

15. The method according to claim 1, wherein, in the semiconductor device structure formation process, the semiconductor device structure is formed as a longitudinal type MOSFET (metal-oxide-semiconductor field-effect transistor) structure.

16. The method according to claim 1, wherein, in the semiconductor device structure formation process, the semiconductor device structure is formed as a lateral type MOSFET (metal-oxide-semiconductor field-effect transistor) structure.

17. The method according to claim 1, wherein, in the semiconductor device structure formation process, the semiconductor device structure is formed as a PN type diode structure.

18. A semiconductor device manufactured using the method according to claim 1, wherein the thickness of the silicon carbide bulk substrate of the semiconductor device is in the range from 50 to 100 μm.

19. A semiconductor apparatus having the semiconductor device according to claim 18.

* * * * *